United States Patent
Watarai et al.

(10) Patent No.: US 6,285,546 B1
(45) Date of Patent: Sep. 4, 2001

(54) MOUNTING STRUCTURE FOR ELECTRONIC DEVICE

(75) Inventors: Michihito Watarai, Isehara; Yutaka Hayashi, Hadano; Mitsuo Miyamoto, Hadano; Kazuhiro Matsuo, Hadano; Eiji Kadomoto, Hadano; Koji Nakayama, Minamiashigara; Akihiro Sakurai; Shigeyasu Tsubaki, both of Hadano, all of (JP)

(73) Assignees: Hitachi, Ltd., Tokyo; Hitachi Information Technology Co., Ltd., Ashigarakami-gun, both of (JP)

( * ) Notice: Subject to any disclaimer, the term of this patent is extended or adjusted under 35 U.S.C. 154(b) by 0 days.

(21) Appl. No.: 09/450,380

(22) Filed: Nov. 29, 1999

(30) Foreign Application Priority Data

Dec. 3, 1998 (JP) .................................. 10-344487

(51) Int. Cl.⁷ .................................................. H05K 7/20
(52) U.S. Cl. ............................................ 361/695; 361/719
(58) Field of Search .................... 454/184; 312/236; 165/121–126, 80.3; 361/687, 690, 694, 695, 717–719, 788

(56) References Cited

U.S. PATENT DOCUMENTS

| | | | |
|---|---|---|---|
| 4,731,703 | * | 3/1988 | Tsukaguchi . |
| 5,680,294 | * | 10/1997 | Stora . |
| 5,680,295 | * | 10/1997 | Le . |
| 5,808,876 | * | 9/1998 | Mullenbach . |
| 5,949,656 | * | 9/1999 | Pinault . |
| 5,991,163 | * | 11/1999 | Marconi . |
| 6,025,989 | * | 2/2000 | Ayd . |
| 6,076,142 | * | 6/2000 | Corrington . |

* cited by examiner

Primary Examiner—Gerald Tolin
(74) Attorney, Agent, or Firm—Antonelli, Terry, Stout & Kraus, LLP

(57) ABSTRACT

An electronic device has a frame and a back board having plural logical units and power supply units mounted thereon. The logical units and the power supply units are alternately located on both sides of the back board in the center of the frame so that the power supply units mounted on one side of the back board may feed a power to the closest logical units mounted on the other side. Further, the air flow paths to be circulated through the logical units and the power supply units are formed so that each unit may be efficiently cooled by the air fed by an air fan unit. As a result, the feeding voltage becomes uniform and the cooling efficiency is improved.

12 Claims, 5 Drawing Sheets

(FRONT)

(FRONT)

(REAR)

(FRONT)

(REAR)

MOUNTING STRUCTURE FOR ELECTRONIC DEVICE

BACKGROUND OF THE INVENTION

The present invention relates to a mounting structure for an electronic device on which logical units and power supply units are to be mounted. More particularly, the invention relates to the mounting structure for an electronic device provided with such a power supply method and a unit layout as implementing the highly efficient power supply and cooling operation.

FIG. 7 shows an electronic device on which a multiple of printed boards are mounted according to the prior art. As shown in FIG. 7, for example, a host computer is configured so that logical units 22 and power supply units 23 are mounted on a frame 21 formed like a box. This type of computer includes a back board 25 one surface and the other surface of which normally have their corresponding units mounted thereon. In the configuration shown in FIG. 7, the logical units 22 are mounted on one surface of the back board 25 as being guided by the frame 21 and the guide rails 24. Each logical unit 22 includes lots of semiconductor elements (LSI) and the other components mounted thereon. In the lower portion of the box is located an air fan unit for feeding cooling air to the logical units 22 and the power supply units 23 located in the upper portion thereof. This cooling air serves to cool down the logical units 22 and the power supply units 23. The multiple of power supply units 23 operate to feed their respective powers. For example, as shown in FIG. 8, a power supply unit 23a feeds a power of 1.2 V, another power supply unit 23c feeds a power of 3.3 V, and another power supply unit 23c feeds a power of 5 V. In this case, the power supply unit 23a operates to feed a power of 1.2 V to the logical units 22 through a power supply bus bar 27 and the back board 25.

However, the conventional mounting structure includes set of logical units mounted collectively on one surface of the back board 25 and a set of power supply units 23 mounted collectively on the other surface thereof. This structure involves the following disadvantages. That is, since the logical units 22 generally have a larger heat quantity than the power supply units 23 and they are mounted in the upper and the lower stages of the frame 21, the higher heat value caused by the semiconductor elements included in the logical unit 22 is concentrated on one surface of the back board 25 (this side of FIG. 7).

As described above, one power supply unit 23a operates to feed a power of 1.2 V to a plurality of logical units 22 through the power supply bus bar 27 composing a power supply path 27a. Hence, the power supply bus bar 27 through which the power supply unit 23 feeds a power is connected to the back board 25 in a branched manner. It means that the length of the power supply bus bar 27 is respective depending on the distance between the power supply unit 23a and each logical unit 22. As a result, the shortest path and the longest path from the power supply unit 23 and the logical unit 22 may be provided. As the path is made longer, the drop of the voltage supplied from the power supply unit 23a is made larger. It has a problem of varying the voltage drop according to each path length.

Further, in the foregoing mounting structure, in a case that the two logical units 22 are mounted vertically in the upper and the lower stages, the guide rails 24 are located in the upper and the lower portions of the logical unit 22. However, where the logical unit is mounted only in the lower stage, the guide rail 24 for guiding the logical unit 22 located in the upper stage is not required, so that no guide rail 24 is located on the top surface of the box. As shown in FIG. 8, the guide rail 24 is a tabular form having an opening in the center thereof for holding the logical unit 22 on which the semiconductor elements are mounted. The provision of the guide rail 214 serves to narrow the flow path of the cooling air, thereby resisting the flow of the cooling air. Hence, if the guide rail 24 exists in some place while it does not exist in another place, the presence or the absence of the guide rail 24 for resisting the flow of the cooling air results in bringing about the variation of the quantity of the cooling air for cooling the logical unit 22.

Morever, as shown in Fig. 9, the foregoing mounting structure is constructed so that the logical unit 22 has plural LSIs 29 mounted thereon, the back board 25 has plural LSIs 28 as well, and the logical unit 22 is mounted on the back board 25 along the guide rail 30. This mounting structure is cooled by the cooling air fed from the lower portion of FIG. 9. However, the flow path of the cooling air for the LSIs 28 is not partitioned from the flow path of the cooling air whose temperature is raised by the heat of the LSIs 29. This phenomenon makes the design of the cooling structure difficult.

SUMMARY OF THE INVENTION

As described above, the mounting structure for an electronic device according to the prior art is constructed so that the high heat is concentrated on one surface of the back board 25. Further, the presence or the absence of the guide rail 24 results in bringing about the difference of the amount of the cooling air for cooling the logical units 22. Moreover, the conventional mounting structure has a disadvantage that the heat of the LSIs 29 of the logical unit 22 give an adverse effect onto the LSIs 28 mounted on the back board. These disadvantages make the heat distribution inside of the box uneven and thereby the cooling efficiency lower.

Further, the mounting structure for an electronic device according to the prior art also has a disadvantage that a variety of lengths of the power supply paths between the power supply units 23 and the logical units 22 result in bringing about a variety of voltage drops, thereby making the supply voltage to each logical unit 22 uneven.

It is an object of the present invention to provide a mounting structure for an electronic device which is constructed to eliminate the disadvantages involved in the foregoing prior art and make the heat distribution inside of the box even, improve the cooling efficiency, and make the power voltage to each logical unit even.

Concretely, the object of the present invention is to provide a mounting structure for preventing concentration of heat appearing in the logical unit and the power supply unit and dispersing the heat, a mounting structure for increasing the flow passing through a unit in which a large amount of heat appears for dispersing the heat caused in each unit and making the heat even in the case of mounting the back board having the logical units and the power supply units mounted thereon vertically in the upper and the lower stages, a mounting structure for keeping the LSIs mounted on the back board from the influence of the rise of the air temperature caused by the heat of the logical units and the power supply units, a mounting structure for connecting the logical units to the corresponding power supply units for feeding an electric power t to the logical units by the shortest path, and a mounting structure for keeping a one-to-one correspondence between the logical unit and the corresponding power supply unit.

In order to achieve the foregoing object, according to an aspect of the invention, a mounting structure for an electronic device having plural logical units and plural power supply units for feeding a power to the logical units, both mounted on a back board, and an air fan unit for feeding cooling air to the logical units and the power supply units, has a first feature that the power supply units and the logical units are located alternately on each surface of the back board in a manner that the logical unit on one surface of the back board is opposed to the power supply unit on the other surface thereof and the power supply feeds an electric power to the logical unit closer thereto.

The present invention has a second feature that the distance between each power supply unit and each logical unit connected thereto through the back board is made even. Further, the present invention has a third feature that the logical unit has a larger heat quantity than the power supply units. The logical units, the power supply units, and the back board have the corresponding air flows, and the air flow unit serves to feed the cooling air to each air flow path. Moreover, the present invention has a fourth feature that the mounting structure is constructed to make the air flow for the power supply units have a larger resistance for air flow than the air flow for the logical units.

Moreover, the present invention has a fifth feature that the logical units and the power supply units are located alternately at least on one surface of the back board and the power supply units are located below the logical units located in the lower stage so that the air flow unit serves to supply the cooling air to the logical units and the power supply units.

DESCRIPTION OF THE EMBODIMENTS

Figure 1:
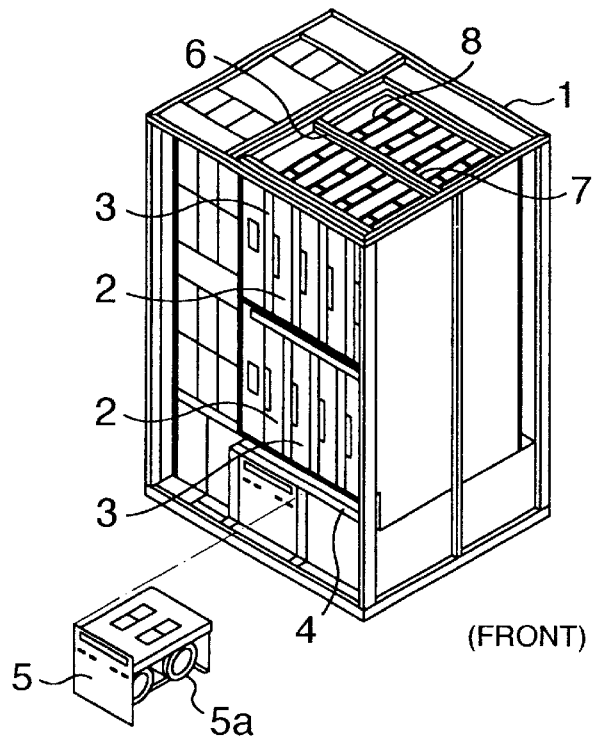
FIG. 1 is a perspective view showing a front surface of a device for explaining a mounting structure for an electronic device according to an embodiment of the present invention, the device having an air flow unit 5 mounted in the bottom portion of the box.
Figure 2:
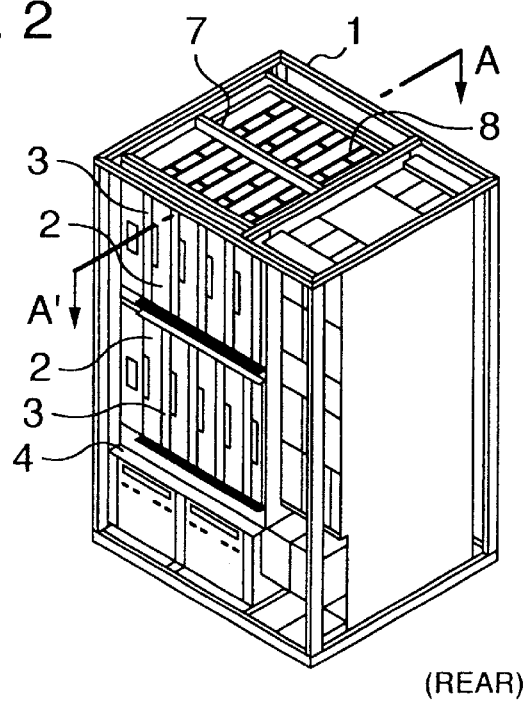
FIG. 2 is a perspective view showing a rear surface of a device for explaining a mounting structure for an electronic device according to the present embodiment of the invention.

Hereafter, the description will be oriented to a mounting structure for an electronic device according to an embodiment of the present invention with reference to the appended drawings. FIG. 1 shows the front surface of the electronic device according to this embodiment. FIG. 2 is a perspective view showing the rear surface of the electronic device according to this embodiment.

The electronic device of this embodiment includes a frame 1 composing an outer boxy appearance of a computer; a plurality of logical units 2 on which plural semiconductor elements are mounted; a plurality of power supply units 3 for feeding an electric power to the logical units; a back board 6 on which the logical units 2 and the power supply units 3 are mounted through guide rails 8; a back board frame 7 for fixing the back board 6; an air fan unit 5 containing a centrifugal air fan 5a for cooling down the logical units 2 and the power supply units 3; and an air fan box 4 for accommodating the air fan unit 5. The power supply unit 3 is different from the conventional power supply unit in a respect that each of those power supply units 3 may feed plural powers of 1.2 V, 3.3 V and 5 V.

The foregoing prior art is constructed so that the logical units are mounted on one surface of the back board, while the power supply units are mounted on the other surface thereof. On the other hand, the mounting structure of the logical units and the power supply units according to this embodiment is constructed so that the logical units and the power supply units are located alternately on both surfaces of the back board 6. If two kinds of units are mounted on one surface in the upper and the lower stages, the logical unit and the power supply unit may be mounted or the same kind of units may be mounted vertically in the two stages. The embodiment is illustrated in FIG. 1. For example, as shown in FIG. 1, in the upper stage of the front surface (this side of FIG. 1) of the back board 6 fixed to the frame 1, the logical units 2 and the power supply units 3 are alternately located lengthwise. In the lower stage, those units are located in the same manner. In this location, the logical units 2 in the upper stage are opposed to the corresponding power supply units 3 in the lower stage. If the power supply units 3 are disposed in the upper stage, the corresponding logical units are disposed in the lower stage. FIG. 1 shows the mounting structure in which the kinds of the units in the upper stage are different from those of the corresponding units in the lower stage. In place, the mounting structure may be constructed so that the kinds of units in the upper stage are the same as those of the corresponding units in the lower stage. That is, the logical units 2 are mounted in the lower stage of the corresponding position to the logical units 3 mounted in the upper stage and the power supply units 3 are mounted in the similar manner.

Figure 5:
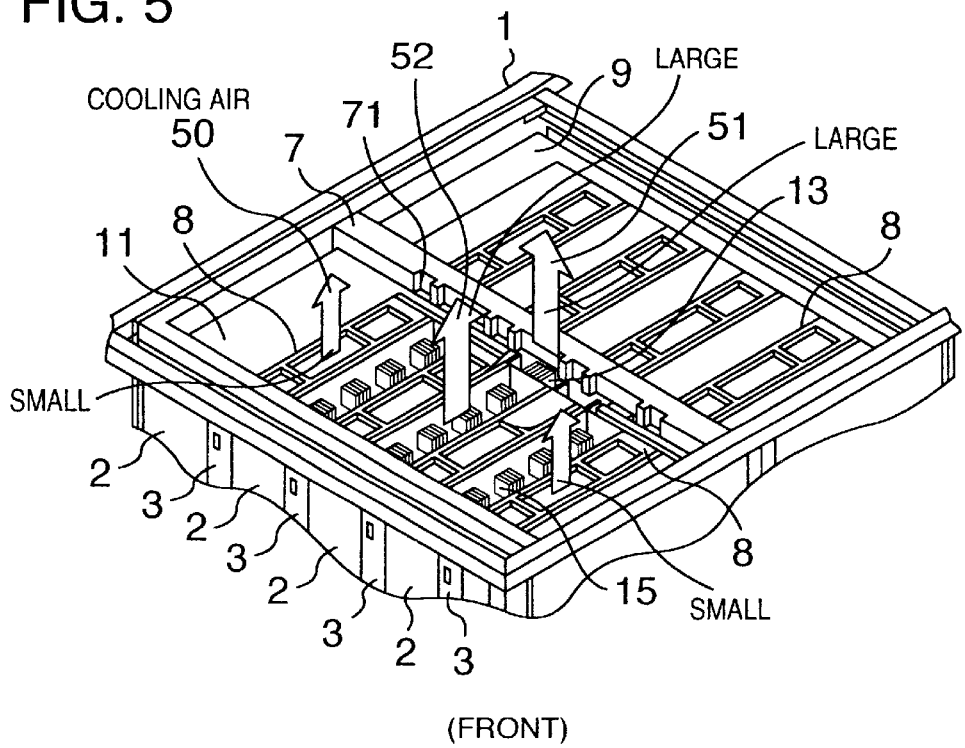
FIG. 5 is an enlarged perspective view showing a ceiling portion shown in FIG. 1.
Figure 6:
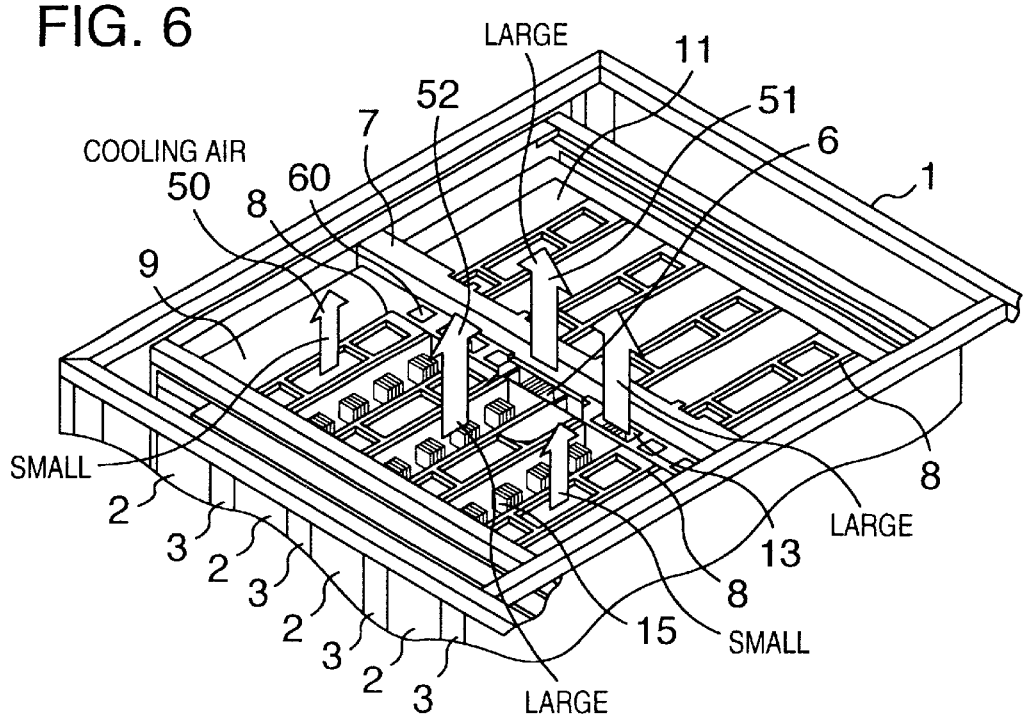
FIG. 6 is an enlarged perspective view showing a ceiling portion shown in FIG. 2.
Figure 7:
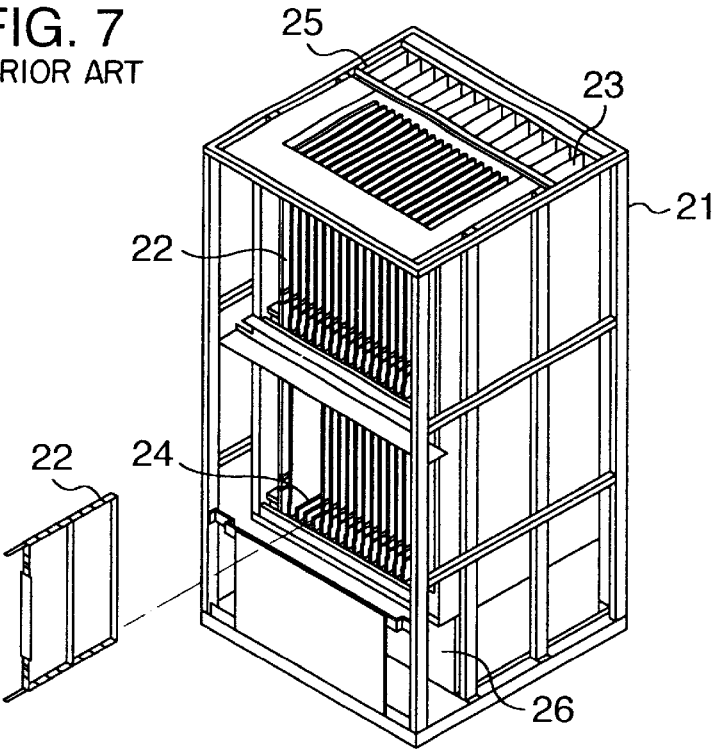
FIG. 7 is an explanatory view showing a mounting structure for an electronic device according to the prior art, the mounting structure having each logical unit 22 being guided by guide rails 24.
Figure 8:
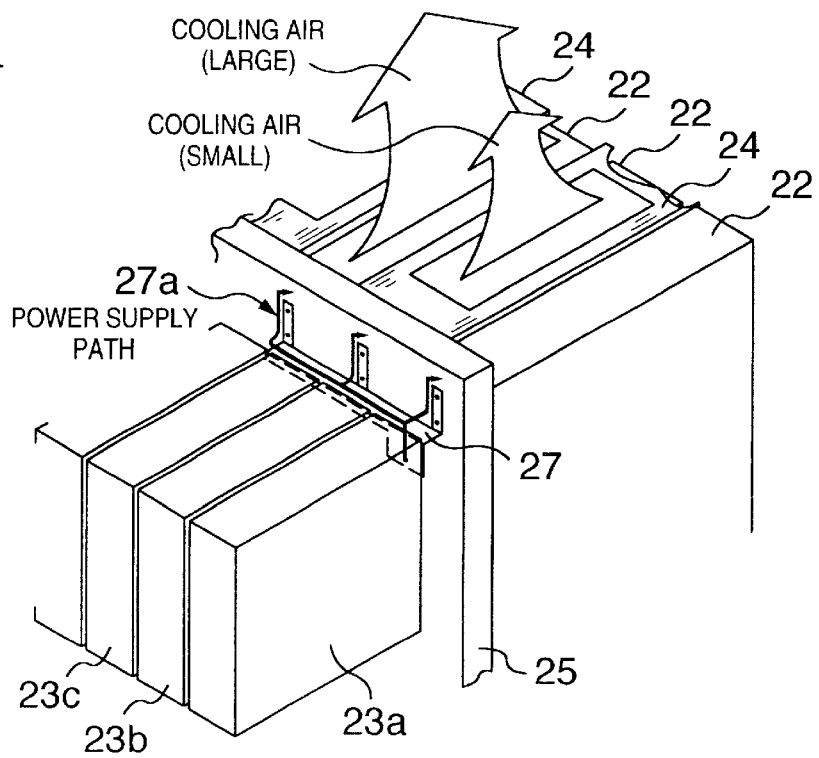
FIG. 8 is an explanatory view showing the mounting and feeding structure for an electronic device according to the prior art, the back board 25 having the power supply units mounted definitively on one surface thereof and the logical units mounted definitively on the other surface thereof.
Figure 9:
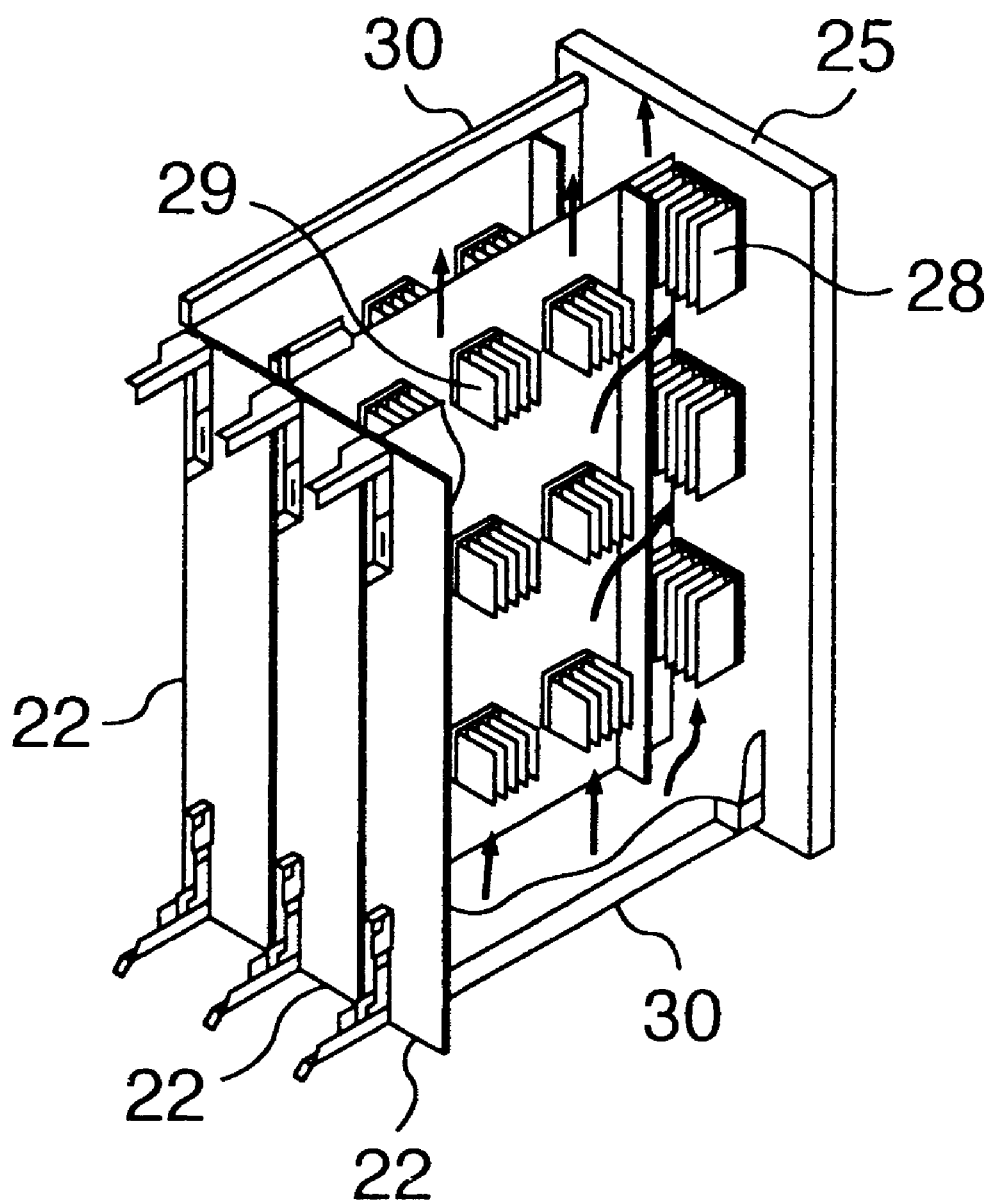
FIG. 9 is a perspective view for explaining a cooling method for LSIs 28 mounted on the back board 25 according to the prior art.

As shown in FIG. 2, the rear surface (this side of FIG. 2) of the back board 6 also include the logical and the power supply units mounted thereon. In the construction shown in FIG. 2 in which the units are mounted on both sides of the back board 6, if the logical units 2 are mounted on the surface of the back board 6, the power supply units 3 are mounted on the corresponding rear surface of the back board 6, while if the power supply units 3 are mounted on the surface of the back board 6, the logical units 2 are mounted on the corresponding rear surface thereof. FIGS. 5 and 6 show the enlarged upper portion of the electronic device shown in FIGS. 1 and 2 in which the logical and the power supply units are alternately located. As is obvious from those figures, as viewed from the front and the rear surfaces of the device, the logical units 2 and the power supply units 3 are alternately located on both sides of the back board 6 and the units at a position of the upper stage is the same as the unit at the corresponding position of the lower stage.

It goes without saying that the structure shown in FIG. 2 is constructed to have the unit mounted at a position of the surface of the back board 6 being different from the unit mounted at the corresponding position of the rear surface thereof. However, the structure may have the same units mounted on the positions of both surfaces of the back board 6.

The logical units 2 and the power supply units 3 of this embodiment form their own boxy tunnel structures for flowing air in the vertical direction of the frame. In the structure of this embodiment, the frame 1 provides a shelf 10 (see FIG. 3) located for supporting the units and an air vent (denoted by a reference number 60 of FIG. 6, for example) in a shelf 9 (see FIGS. 5 and 6) located on the back board 6 on the top of the device. The air vent is formed along an air flow. Further, a cutaway (denoted by a reference number 71 of FIG. 5, for example) is formed along the air flow in a portion of the back board frame 7 for supporting the back board 6.

Figure 3:
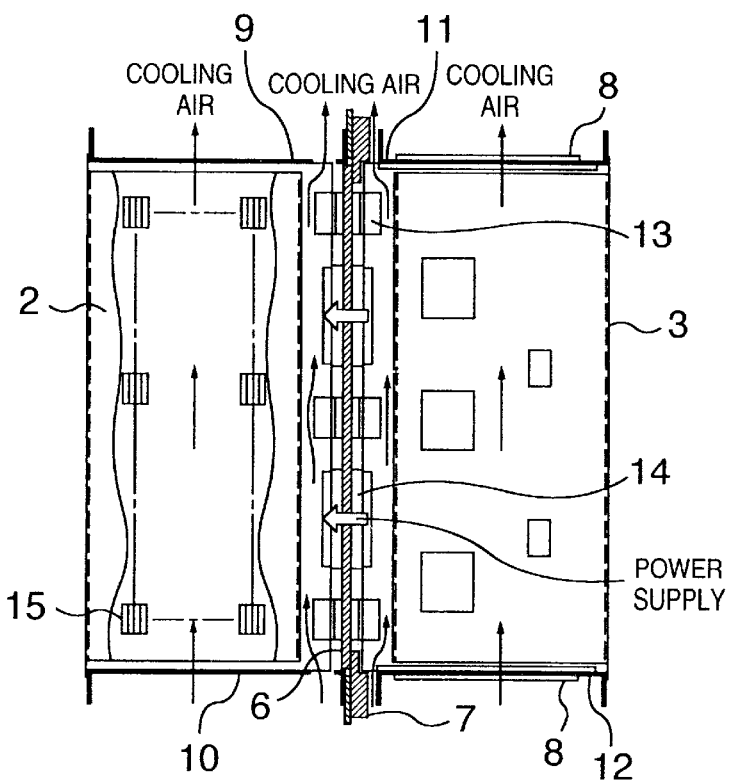
FIG. 3 is a longitudinal section of FIG. 2 (cut in line A–A') showing relation of a mounting position between the logical units and the power supply units, the power supply unit, the logical unit, and the back board having their own cooling air flows.
Figure 4:
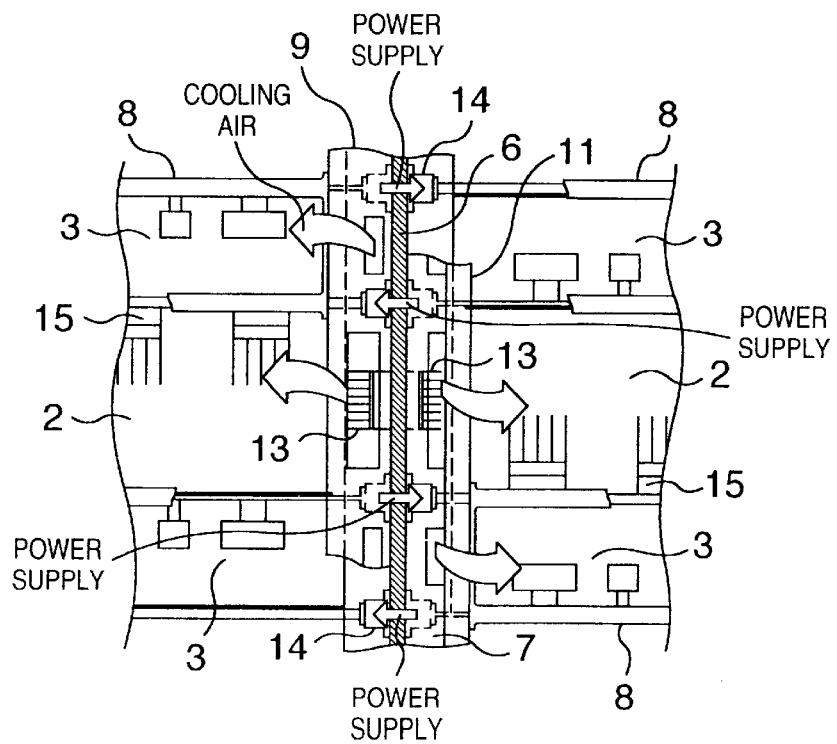
FIG. 4 is an enlarged top view showing the portion around the back board on the top surface shown in FIG. 1.

According to this embodiment, the air fan unit 5 located in the lower portion of the box serves to feed cooling air upwardly. As shown in FIG. 3, the cooling air serves to cool down the semiconductor elements (LSIS) of the logical units 2 mounted on one surface of the back board 6. The cooling air for cooling down the logical unit 2 are exhausted to the upper portion of the box through the boxy cylinder (tunnel) containing the surface on which the logical units 2 are mounted. The cooling air for cooling down the power supply unit 3 is exhausted to the upper portion of the box through the space containing the surface on which the elements such as the power supply coils of the power supply units are mounted. As shown in FIG. 4, the cooling air is exhausted to the upper portion of the box through the boxy cylinder located inside of the logical units 2 and the power supply units 3 located alternately on both sides of the back board 6. In addition, FIG. 4 shows the structure in which the same kinds of units are located at the corresponding positions of both sides of the back board 6.

As shown in FIGS. 5 and 6, the flow amount of the exhausted air is adjusted so that the flow amount of the cooling air 50 exhausted from the guide rail 8 is made small and the flow amount of the cooling air 52 exhausted through the logical units 2 is made large because the hollow and tabular guide rails 8 located on the upper surface of the locations where the power supply units 3 are mounted are served as a resistance for a flow path.

Further, the logical unit 2 and the power supply unit 3 are formed like a boxy so that the air is circulated vertically in the frame 1. Hence, the independent air flow path is formed closer to the back board 6. As a result, the cooling air fed upwardly from the air fan unit 5 is exhausted only closer to the LSIs 13 mounted on the back board 6. Hence, this structure serves to prevent the mixture of the cooling air for alleviating the heat caused in the LSIs 13 with the cooling air for cooling down the semiconductor elements (LSIS) of the logical units 2.

In particular, in this embodiment, the guide rails 8 for the logical units 2 serving to resist the air flow are located alternately as viewed from the exhaust surface located on the top of the device (concretely, the logical units and the power supply units are located alternately) and both sides of the back board 6 and the cooling air is exhausted from the overall surface of the top of the device shown in FIGS. 5 and 6. This structure serves to uniformize the heat distribution over the overall surface of the device, thereby improving the cooling efficiency.

The guide rails 8 are located in the upper and the lower portions of the power supply unit 3 so that the power supply unit 3 of a large heat quantity and the logical unit 2 of a small heat quantity are both mounted through the guide rails 8. The guide rails 8 serve to resist the flow of the cooling air flowing through the power supply unit 3 of a small heat quantity, thereby decreasing the air flow, while it does not serve to resist the flow of the cooling air flowing in the logical unit 2 of a large heat quantity. This makes it possible to increase the air flow amount. Conventionally, the influence on the LSIs and the connectors mounted on the back board by the temperature rise of the cooling air caused by the heat of the units cannot be forecasted easily, so that the study of the cooling structure has been difficult. However, the mounting structure of this embodiment makes it possible to forecast the influence on the basis of the simple model.

The mounting structure of this embodiment is constructed to feed an electric power from the power supply unit 3 mounted on one surface of the back board 6 to the corresponding logical unit 2 mounted on the other surface thereof. This structure makes it possible to keep the same physical distance between the power supply unit 3 and the corresponding logical unit 2. This also makes it possible to keep the same length of the feeding path for connecting the logical unit 2 with the corresponding power supply unit 3, keep all the voltages to be supplied to the logical units 2 the same, and thereby prevent the voltage drop caused by a variety of feeding paths.

In the embodiment shown in FIG. 4, the power supply unit 3 mounted on the back board 6 is served to supply an electric power to the closest logical unit 2 located behind the back board. The feeding path is the shortest and direct wire inside of the connector 14 and the back board 6. Unlike the conventional structure wherein the power is supplied from the power supply units unitized according to respective voltages, by employing the structure of this embodiment, only one power supply unit 3 enables to supply plural voltages required for operating the logical units 2. That is, by using the power supply unit 3 allowed to supply plural voltages, the one-to-one correspondence may be taken between the logical unit 2 and the power supply unit 3. This makes it possible to eliminate the accessory components to the conventional feeding bus bar. It is therefore possible to prevent voltage drop while the power passes through the feeding bus bar, reduce the number of components and thereby the number of manufacturing steps, lower the cost, improve the assembling characteristic, and design the product compactly.

Further, the present invention may be represented by the following embodiments.

First, the mounting structure for an electronic device including a back board having the logical units and the power supply units mounted thereon and an air fan for cooling the back board and the units during the operation in a box or a frame is characterized in that the back board has plural first connectors and the end portions of each logical unit and power supply unit have second connectors to be connected to said first connectors. By coupling the logical units onto the back board through the connectors, the power supply units for feeding an electric power to the logical units are mounted on the right side of the logical units or right behind the logical units through the back board laid therebetween, that is, the power supply units are connected to the logical units by the shortest distance. This structure has an advantage of making the feeding components such as the feeding bus bar unnecessary.

Second, in a case that the logical units and the power supply units are mounted on the back board, the distance between one logical unit and one power supply unit for feeding an electric power to the logical unit is the same wherever the logical unit may be mounted. This mounting structure of this embodiment does not necessarily make the distance between the logical unit and the power supply unit the shortest. Further, since the length of the feeding path is kept the same for any logical unit, it is effective to make the voltage drop unified. Further, the distance between one logical unit and the corresponding power supply unit is not completely required to be the same. The foregoing effect may be obtained if the distance between almost every logical unit and almost every corresponding power supply unit is the same.

Third, if the difference of the heat quantity takes place between the logical unit and the power supply unit, the units of a large heat quantity and the units of a small heat quantity are coupled on the back board in a manner to allow the former units to be alternate to the latter units. This structure serves to prevent concentration of heat more than the straightforward range of the units of a large heat quantity coupled on the back board, thereby making it possible to diffuse or uniformize the heat.

Fourth, in a case that the back board is fixed in the box or the frame and the units are mounted in the upper and the lower stages, the alternate range of the logical units and the power supply units located on the back board is arranged so that the range in the upper stage is shifted by one unit from the range in the lower stage. This mounting ranges makes it possible to uniformize the air temperature rise value caused by the heat of each unit leading from the lower portion to the upper portion of the box or the frame. If those units are mounted on the two back boards in place of mounting the units on one back board in the upper and the lower stages, the first back board located in the upper stage of the box may be shifted by one unit from the second back board located in the lower stage of the box, for obtaining the same effect as the above.

Fifth, in a case that the logical units and the power supply units are alternately mounted on the back board, the guide rails for mounting the units are located in the upper and the lower portions of the unit of a small heat quantity because of the difference of the heat quantity between those units. As a result, the guide rails served to resist the flow of the cooling air may not be mounted in the upper and the lower portions of the unit of a large heat quantity, thereby increasing the amount of the cooling air flown into the units of a heat value.

Sixth, the description will be oriented to the case that the LSIs mounted on the back board are required to be cooled down. By forming air vents at the back of a shelf on which the units are mounted or forming grooves at the place where no air vent cannot be formed, the mounting structure for an electronic device is composed so that the cooling air is flown to the LSIs mounted on the back board.

Seventh, each electronic unit is made boxy so that the cooling air for cooling the LSIs mounted on the back board may not be influenced by the air temperature rise caused by the heating of another electronic unit. This mounting structure may have an apparent tunnel and a cooling structure for efficiently cooling down the LSIs.

As set forth above, according to the present invention, by alternately locating the logical units and the power supply units on both sides of the back board and mounting the power supply units on the back board as the border so that they may feed an electric power to the closer logical units, the heat inside of the box can be uniformized. Further, by making the distance between every power supply unit and every corresponding logical unit both of which are connected through the back board, the disadvantageous difference of the feeding voltage caused by the difference of the feeding path length can be solved.

According to the present invention, the logical units have a large heat quantity, while the power supply units have a small heat quantity. The logical units, the power supply units, and the back board have their own air flow paths so that the air fan unit may supply the cooling air to each air flow path, thereby improving the cooling efficiency. Further, the air flow path formed for the power supply units has a larger air flow resistance than the air flow path formed for the logical units. By this structure, the large amount of cooling air is supplied to the logical units of a large heat quantity, thereby improving the cooling efficiency.

Further, according to the present invention, in a case that the logical unit has a larger heat quantity than the power supply unit, the logical units and the power supply units are alternately located, the power supply units are mounted below the logical units in the upper stage or the logical units are mounted below the power supply units in the upper stage, and the air fan unit mounted in the bottom of the box serves to supply cooling air to the logical units and the power supply units. This structure makes it possible to prevent concentration of the heat inside of the box, thereby improving the cooling efficiency.

What is claimed is:

1. An electronic device comprising:
   a back board having plural logical units and plural power supply units for supplying electric power exclusively and supplying electric power to said logical units mounted thereon;
   an air fan unit provided in a lower portion of said electronic device for feeding cooling air to said logical units and said power supply units; and
   wherein said logical units and said power supply units are both located on both sides of said back board.

2. The electronic device as claimed in claim 1, characterized by locating said logical units on the opposite side of said back board to the side where said power supply units are mounted.

3. An electronic device as claimed in claim 2, wherein said power supply units are connected so that they feed an electric power to said logical units mounted on the opposite side through said back board.

4. An electronic device as claimed in claim 3, wherein said power supply units and said corresponding logical units are connected through said back board, each said power supply unit being disposed on a front surface of the back board and a corresponding said logical unit being disposed on the back surface of the back board as a pair, the distance between each power supply unit and logical unit pair being the same.

5. An electronic device as claimed in claim 1, wherein said power supply units are connected so that they feed electronic power to the closest logical units, respectively.

6. An electronic device as claimed in claim 1, wherein said plural logical units and said power supply units mounted on one side of said back board are alternately located.

7. An electronic device as claimed in claim 6, wherein said logical units and said power supply units are mounted on said back board in upper and lower stages, said logical units and said power supply units in said upper stage or said lower stage are alternately located, and power supply units mounted on the lower stage being disposed under logical units mounted on the upper stage, logical units mounted on the lower stage being disposed under power supply units mounted on the upper stage.

8. An electronic device as claimed in claim 6, wherein said logical units and said power supply units are mounted on said back board in upper and lower stages, said logical units and said power supply units in the lower or the upper stage are alternately located, and power supply units mounted on the lower stage being disposed under power supply units mounted on the upper stage, logical units mounted on the lower stage being disposed under logical units mounted on the upper stage.

9. An electronic device as claimed in claim 1, wherein said air fan unit is located in a lower portion than said logical units and said power supply units.

10. An electronic device as claimed in claim 1, wherein said logical units, said power supply units, and said back board have their own air flow paths and said air fan unit serves to feed cooling air to each of said air flow paths.

11. An electronic device as claimed in claim 8, wherein the air flow path for said power supply units has a larger air flow resistance than the air flow path for said logical units.

12. An electronic device including a back board having logical units and power supply units mounted thereon and an air fan unit for cooling said back board and units during the operation, said back board and said air fan unit being mounted in a box or a frame, characterized in that said back board includes plural first connectors, the end portions of said logical units and said power supply units include second connectors to be coupled to said first connectors, said logical units are coupled onto said back board by coupling said first connectors with said second connectors, said power supply units for feeding a power to said logical units being located right behind said logical units through said back board;

wherein said logical units and said power supply units are both located on both sides of said backboard.

* * * * *